United States Patent
Isham et al.

(10) Patent No.: US 6,700,365 B2
(45) Date of Patent: Mar. 2, 2004

(54) PROGRAMMABLE CURRENT-SENSING CIRCUIT PROVIDING DISCRETE STEP TEMPERATURE COMPENSATION FOR DC-DC CONVERTER

(75) Inventors: Robert Haynes Isham, Flemington, NJ (US); Paul K. Sferrazza, Somerville, NJ (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/304,203

(22) Filed: Nov. 26, 2002

(65) Prior Publication Data
US 2003/0107358 A1 Jun. 12, 2003

Related U.S. Application Data
(60) Provisional application No. 60/338,953, filed on Dec. 10, 2001.

(51) Int. Cl.⁷ .............................................. G05F 1/613
(52) U.S. Cl. ........................................ 323/317; 323/283
(58) Field of Search ................................ 323/224, 283, 323/288, 282, 284, 907, 318, 322

(56) References Cited

U.S. PATENT DOCUMENTS 5,134,355 A * 7/1992 Hastings .................... 323/211
6,246,220 B1   6/2001 Isham et al. ................ 323/224

* cited by examiner

Primary Examiner—Shawn Riley
(74) Attorney, Agent, or Firm—Allen, Dyer, Doppelt, Milbrath & Gilchrist, P.A.

(57) ABSTRACT

A programmably switched, multi-output stage current mirror-based, current-sensing and correction circuit controls the operation of a buck mode DC—DC converter. This correction circuit generates a correction current having a prescribed step-wise temperature-compensating relationship to sensed current. The sensed current is derived from a variable impedance controlled by a sense amplifier coupled via a current feedback resistor to the common output node between a high side power switching device and a low side power switching device of the converter. To program the correction circuit a decoder maps temperature information associated with the low side power switching device and additional programming information into a current mirror control code.

20 Claims, 3 Drawing Sheets

PROGRAMMABLE CURRENT-SENSING CIRCUIT PROVIDING DISCRETE STEP TEMPERATURE COMPENSATION FOR DC-DC CONVERTER

CROSS-REFERENCE TO RELATED APPLICATION

The present application claims the benefit of co-pending U.S. Provisional Patent Application, Serial No. 60/338,953, filed Dec. 10, 2001, entitled: "Discrete Step Temperature Compensated Current Sensing Technique for DC to DC," by R. Isham et al, assigned to the assignee of the present application and the disclosure of which is incorporated herein.

FIELD OF THE INVENTION

The present invention relates in general to electronic circuits and components therefor, and is particularly directed to a new and improved controllably switched current mirror-based, current-sensing and correction circuit that provides programmable, discrete step compensation for temperature variations of an output switching MOSFET of a buck mode DC—DC converter.

BACKGROUND OF THE INVENTION

Electrical power for an integrated circuit (IC) is typically supplied by one or more direct current (DC) power sources, such as a buck-mode, pulse width modulation (PWM) based, DC—DC converter of the type diagrammatically shown in FIG. 1. As shown therein, a controller 10 supplies a PWM signal to a (MOSFET gate) driver 20, for controlling the turn-on and turn-off of a pair of electronic power switching devices, to which a load is coupled. In the illustrated DC—DC converter, these power switching devices are depicted as an upper (or high side) power NMOSFET (or NFET) device 30, and a lower (or low side) power NFET device 40, having their drain-source current flow paths connected in series between a pair of power supply rails (e.g., VIN and ground (GND)).

The upper NFET device 30 is turned on and off by an upper gate switching signal UGATE being applied to its gate from driver 20, and the lower NFET device 40 is turned on and off by a lower gate switching signal LGATE from driver 20. A common node 35 between the upper and lower NFETs is coupled through an inductor 50 (which may typically comprise a transformer winding) to a load reservoir capacitor 60 coupled to a reference voltage terminal (GND). A connection 55 between inductor 50 and capacitor 60 serves as an output node from which a desired (regulated) DC output voltage VOUT is applied to a LOAD 65 (shown as coupled to GND).

The output node connection 55 is also fed back to error amplifier circuitry (not shown) within the controller, the error amplifier being used to regulate the converter's output DC voltage relative to a reference voltage supply. In addition, the common node 35 is also coupled to current-sensing circuitry 15 within controller 10, in response to which the controller adjusts the PWM signal, as necessary, to maintain the converter's DC output within a prescribed set of parameters.

For this purpose, the controller may incorporate a current-sensing circuit of the type described in U.S. Pat. No. 6,246,220, entitled: "Synchronous-Rectified DC to DC Converter with Improved Current Sensing," issued Jun. 12, 2001, by R. Isham et al, assigned to the assignee of the present application and the disclosure of which is incorporated herein. As described therein, the controller monitors the source-drain current flowing through the lower NFET 40 by way of a current-sensing or scaling resistor 37 electrically interconnected between node 35 and a current-sensing circuit 15.

The current-sensing circuit is operative to monitor the current $I_{SENSE}$ flowing through scaling resistor 37. This current is the product of the output current $I_{OUT}$ flowing from the common node 35 to the inductor 50 times the ratio of the ON-resistance $R_{DS40ON}$ of the lower NFET 40 to the resistance $R_{37}$ of the scaling resistor 37, and is thus proportionally representative of the output current $I_{OUT}$. The load current $I_L$, namely the current $I_{50}$ flowing through the inductor 50, is substantially equal to the output current $I_{OUT}$ minus the current $I_{SENSE}$ flowing through the scaling resistor 37.

As the ratio of $R_{DS40ON}$ to $R_{37}$ is typically relatively small, the current $I_{SENSE}$ will be substantially smaller than the output current $I_{OUT}$, so that the output current $I_{OUT}$ and the load current $I_L$ will have substantially similar magnitudes, making $I_{SENSE}$ representative of load current. The resistance of the scaling resistor 37 is selected to provide a prescribed value of current flow for the values of load current $I_L$ and/or the value of the ON-state resistance $R_{DS40ON}$ of the lower NFET 40. Thus, the sensitivity or magnitude of, for example, voltage droop, current limiting or trip, and current balancing incorporated into the DC/DC converter is effectively 'scaled' by selecting resistor 37 relative to the value of the on-state resistance $R_{DS40ON}$ of the lower NFET 40. The voltage drop across the on-state resistance $R_{DS40ON}$ of the lower NFET 40 (usually negative) is accommodated in the converter without a negative voltage supply. In addition, as the ON-resistance $R_{DS40ON}$ of the lower NFET 40 varies with temperature, scaling resistor 37 may be replaced with a network including a positive temperature coefficient thermistor that has a temperature coefficient which offsets the behavior of NFET 40.

As shown in greater detail in FIG. 2, the controller's current-sensing circuit 15 comprises a sense amplifier 200 having a first, non-inverting (+) input 201 coupled to a controller SENSE− port 11, and a second, inverting (−) input 202 coupled to a controller SENSE+ port 12. The SENSE− port 11 is coupled to the grounded termination of NFET 40, while the SENSE+ port 12 is coupled through scaling resistor 37 to common node 35. The sense amplifier 200 has its output 203 coupled to the gate 213 of an NFET 210, whose drain-source path is coupled between the SENSE+ port 12 and input terminal 221 of a current mirror 220. The current mirror 220 includes a diode-connected input PFET 230 having its drain and gate coupled in common to input terminal 221 and its source coupled to voltage supply rail VCC. The gate of PFET 230 is coupled in common to the gate of current mirror PFET 240, the source of which is coupled to the supply rail VCC and the drain of which is coupled to an output terminal 222.

In operation, the sense amplifier 200 and NFET 210 (which serves as a controlled impedance) are operative to continuously drive the controller's SENSE+ port 11 toward ground potential. This forces the end of the current feedback resistor 37 which is connected to controller SENSE+ port 12 to be at ground potential and the end connected to common node 35 to have a negative voltage. The negative voltage at common output node 35 will be equal to the product of the output current $I_{OUT}$ and the on-state resistance $R_{DS40ON}$ between the drain and source of the lower NFET 40.

Current from the current mirror 220 flows into the drain and out of the source of NFET 210 into the SENSE+ port 12.

Also flowing into the SENSE+ port 12 from the opposite direction is the current $I_{SENSE}$ which, as described above, is representative of load current $I_L$. In order to maintain the SENSE+ port 12 at ground potential, sense amplifier 200 adjusts the current flowing through NFET 210 and into SENSE+ port 12 to be substantially equal to $I_{SENSE}$. Since $I_{SENSE}$ is representative of the load current $I_L$, the current flowing through NFET 210 and into SENSE+ port 12, as controlled by sense amplifier 200, is also representative of load current $I_L$. Current mirror 220 mirrors the sensed current flowing through NFET 210 and couples this current via output port 222 to the controller's error amplifier circuitry that monitors the output node 55.

The on state resistance $RDS_{40ON}$ of the lower NFET 40 may increase by up to forty percent, as the temperature increases in a typical application. If scaling resistor 37, which couples the common node 35 to the SENSE+ port 12 does not also increase at the same rate as $RDS_{40ON}$, the fed back current will be in error. To correct for this, resistor 37 may be replaced by a network including a positive temperature coefficient thermistor. This may be both complicated and costly.

SUMMARY OF THE INVENTION

In accordance with the present invention, the above-discussed temperature variation problem is successfully addressed by a new and improved current-sensing and correction circuit, that provides programmable, step-wise temperature compensation, and is configured to be readily incorporated into a DC—DC converter, such as, but not limited to a buck mode converter architecture of the type shown in FIGS. 1 and 2. The front end portion of the invention includes sense amplifier, NFET and current mirror circuitry of FIG. 2.

To provide the step-wise programmable temperature compensating current adjustment functionality of the invention, the current mirror circuitry of FIG. 2 is augmented with a plurality of controllably switched, auxiliary current mirror output stages, the number of which may be arbitrarily large. The auxiliary current mirror output stages are coupled in parallel with the current mirror output PFET of the front end stage's current mirror. Each auxiliary current mirror stage contains a current mirror output PFET having its source-drain path coupled in series with that of an associated controllably switched PFET, between a voltage supply rail and a summation current output terminal. The gates of the auxiliary current mirror PFETs are coupled in common with the gate of the front end stage's current mirror PFET.

When a respective switched PFET is selectively turned-on by a programmed decoder, its associated current mirror output PFET is coupled in parallel with the current mirror output PFET of the front end stage's current mirror, causing the parallel-coupled PFET to supply an additional mirrored 'scaling' current to the current output terminal, and summed with the output current produced by the front end stage's current mirror output PFET. This provides the temperature compensation circuit of the invention with its intended current-scaling functionality in the form of linear combinations of the currents mirrored by one or more auxiliary current mirror output PFETs. As non-limiting examples, the 'scaled' output current may be used for 'droop' compensation and over-current detection. The magnitude of the current provided by a respective auxiliary current mirror PFET will depend upon the ratio of its geometry with that of the front end stage's current mirror input transistor.

In order to control which auxiliary current mirror PFETs provide additional current, the gates of their associated switched PFETs are coupled to decoded output lines of an m×n decoder. The decoder has m programmable inputs coupled to a programming source and a n programming inputs coupled to a switching device control source unit (temperature sensor). The decoder thus effectively serves as a look-up table, and is operative to map its m and n inputs into a P bit output code, that is applied to the controllably switched PFETs of the auxiliary current mirror stages.

To provide temperature-based current compensation for variations in the drain-source resistance of the lower side MOSFET of a buck mode DC—DC converter, the mapping table stored in the decoder may be defined in accordance with a priori knowledge of the thermal behavior characteristics of the MOSFET and/or by the use of a thermal sensor. The use of programming inputs to the decoder provides the designer with flexibility as to placement of thermal detection components for the monitored lower side MOSFET. Thus, if circuit board area does not allow placement of a thermal detector in relatively close proximity of the converter's low side MOSFET, any offset between the actual temperature of the component and a relatively proximate monitoring location may be adjusted by an appropriate programming and mapping scheme for the decoder.

DETAILED DESCRIPTION

Before describing the current-sensing circuit of the invention, which provides programmable, discrete step-wise compensation for variations in the operational temperature of an output switching MOSFET of a buck mode DC—DC converter, it should be observed that the invention resides primarily in an arrangement of conventional DC power supply circuits and control components therefor, and the manner in which they are integrated together to realize a temperature-compensated power supply architecture of the type briefly described in the above summary.

It is to be understood that the invention may be embodied in a variety of other implementations, and should not be construed as being limited to only those shown and described herein. For example, although the non-limiting circuit implementations of the Figures shows the use of MOSFET devices, it will be appreciated that the invention is not limited thereto, but also may be configured of alternative equivalent circuit devices, such as, bipolar transistors. The implementation example to be described is intended to furnish only those specifics that are pertinent to the present invention, so as not to obscure the disclosure with details that are readily apparent to one skilled in the art having the benefit of present description. Throughout the text and drawings like numbers refer to like parts.

Figure 1:
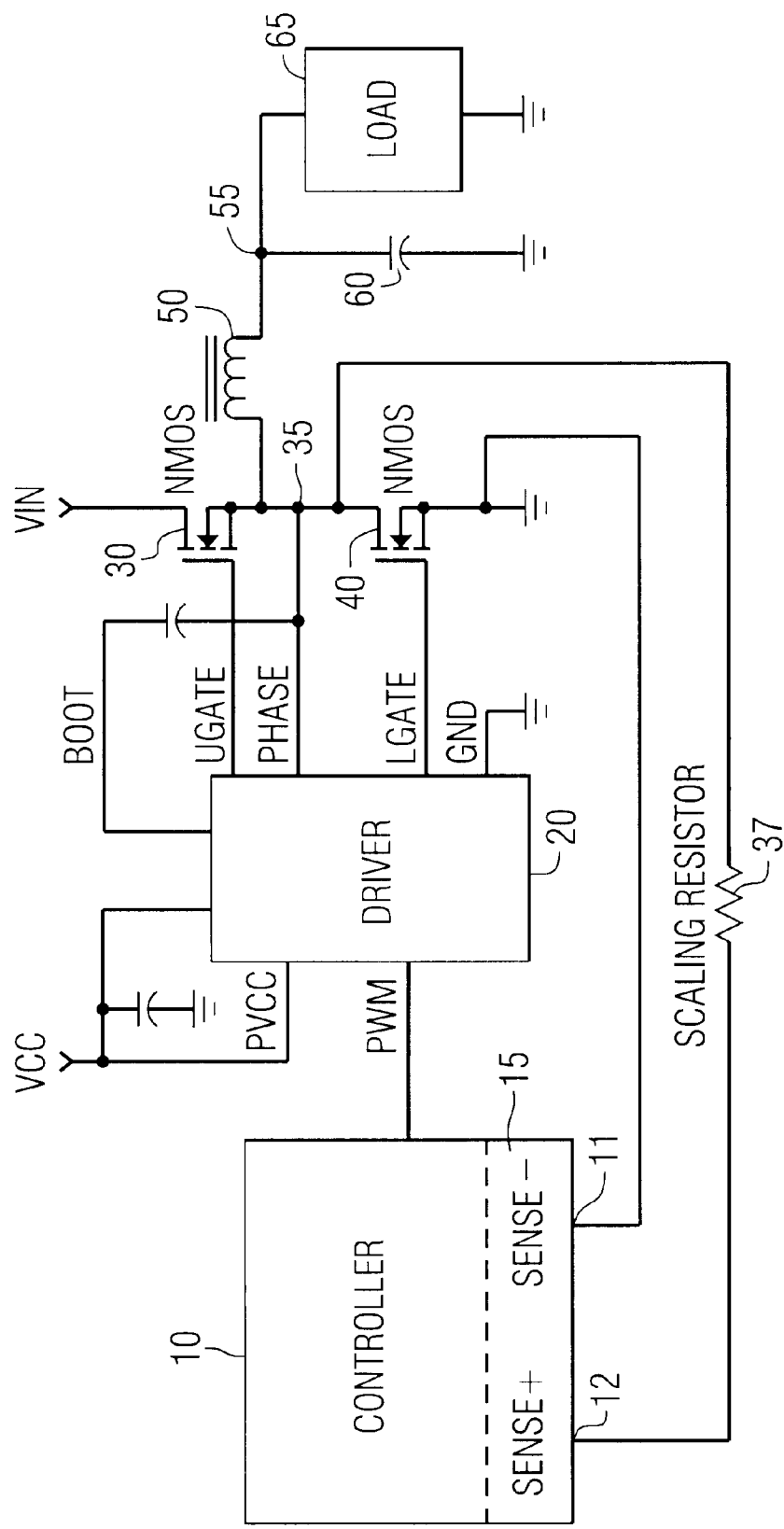
FIG. 1 diagrammatically illustrates a conventional buck-mode, pulse width modulation (PWM) based, DC—DC converter.
Figure 2:
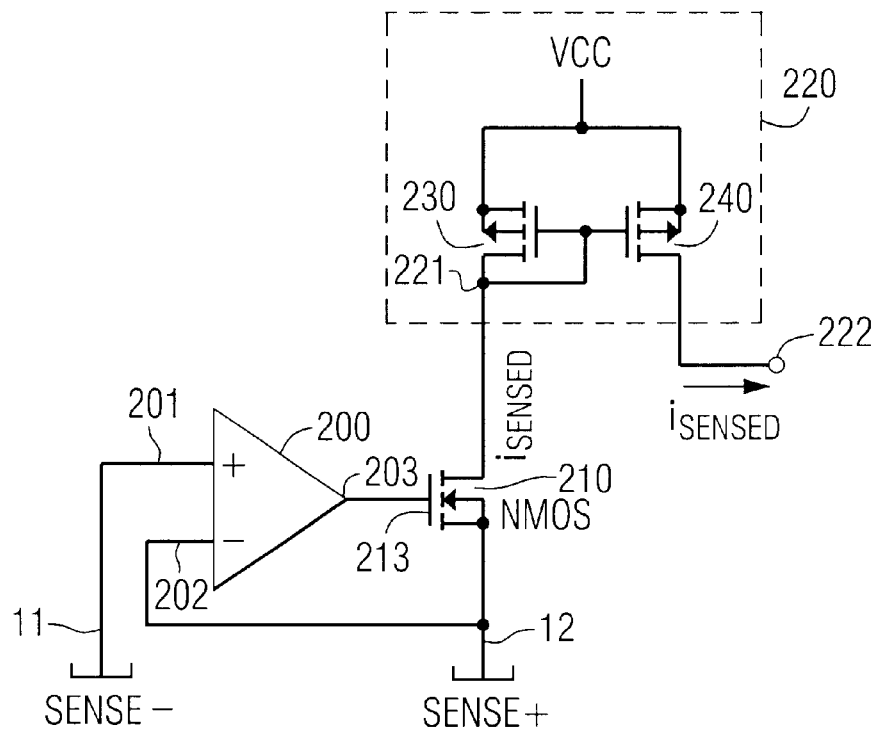
FIG. 2 diagrammatically illustrates a current-sensing circuit for the controller of the DC—DC converter of FIG. 1.
Figure 3:
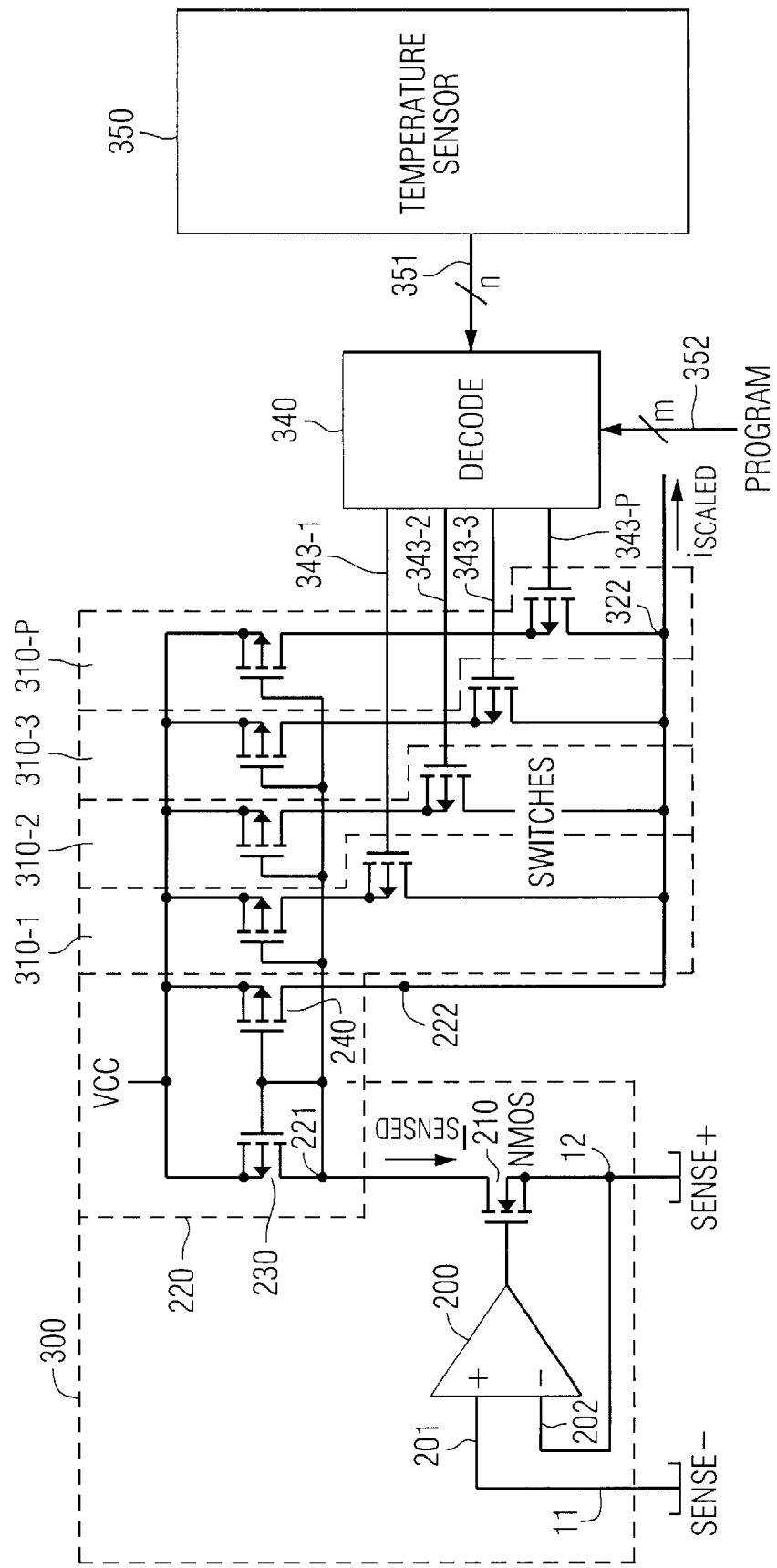
FIG. 3 diagrammatically shows a current-sensing and discrete step programmable temperature-compensation circuit in accordance with the present invention.

Attention is now directed to FIG. 3, which diagrammatically illustrates an embodiment of a current-sensing and correction circuit in accordance with the present invention, containing step-wise programmable temperature compensation circuitry that is configured to be incorporated into a buck mode DC—DC converter of the type shown in FIGS. 1 and 2, described above. A front end portion of the circuit of FIG. 3, shown within broken lines 300, contains the sense amplifier 200, NFET 210 and current mirror 220 of FIG. 2. As such, these components will not be re-explained, except as appropriate to facilitate an understanding of the architecture and operation of the invention.

Figure 4:
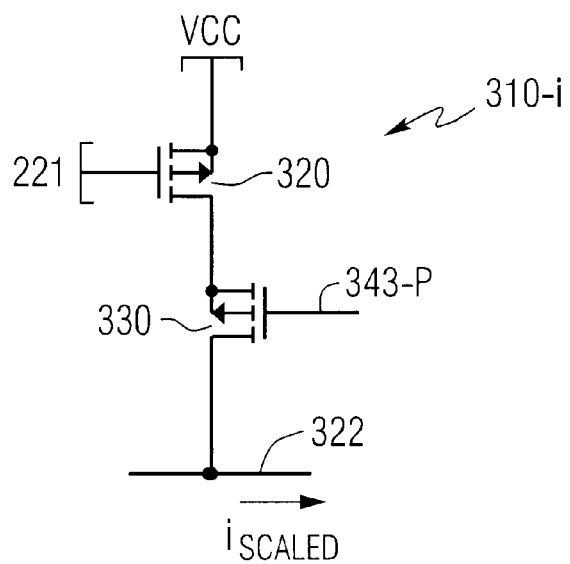
FIG. 4 is an enlarged detail illustration of a respective auxiliary current mirror stage of the current-sensing and temperature-compensation circuit of FIG. 3.

In addition, in order to achieve the intended step-wise programmable current adjustment (temperature compensation) functionality of the invention, the current sensing circuit of FIG. 3 employs a plurality (P) of controllably switched, auxiliary current mirror output stages (four of which are shown at 310-1, 310-2, 310-3, 310-P, as a non-limiting example). The number of auxiliary current mirror stages may be arbitrarily large. These auxiliary current mirror output stages are coupled in parallel with the current mirror output PFET 240 of the front end stage's current mirror 220. As shown in slightly enlarged detail in FIG. 4, a respective auxiliary current mirror stage 310-i contains a current mirror output PFET 320 and an associated controllably switched device, here a PFET 330.

The source-drain path of current mirror output PFET 320 is series coupled with the supply rail VCC and the drain-source path of PFET 330. The gate 321 of current mirror output PFET 320 is coupled in common with the gate of the front end stage's current mirror PFET 240, while the drain-source path of the switched PFET 330 is coupled to a 'scaled' current output terminal 332. Output terminal 332 is coupled in common with output terminal 222 of current mirror 220. As such, when a respective controllably switched PFET 330 turned-on, its associated current mirror output PFET 320 becomes coupled in parallel with the current mirror output PFET 240 of the front end stage's current mirror 240. This enables the parallel-coupled PFET to supply an additional mirrored 'scaling' current component to an output terminal 322.

The 'scaled' current output terminal 322 is coupled in common with the output terminal 222 of the front end stage's current mirror 220, so that the additional mirrored current produced by the auxiliary current mirror stages is summed with the output current produced by the current mirror output PFET 240. This provides the compensation circuit of the invention with its intended current-scaling functionality in the form of linear combinations (summations) of the currents mirrored by one or more auxiliary current mirror output transistors 320. The magnitude of the current provided by a respective auxiliary current mirror transistor 320 will depend upon the ratio of the its geometry with that of the front end stage's current mirror input transistor 230. As a non-limiting example, this geometry ratio may be 1:1.

In order to control which one or more of the auxiliary current mirror PFETs provide additional current to the output current supplied by current mirror transistor 240, the gate 331 of a respective switched PFET 330 is coupled to a respective decode output line 343-i of an m×n decoder 340. The m×n decoder 340 has a first plurality m of programmable inputs 341-1, . . . , 343-M, which are coupled to a programming source (not shown), and a second plurality n of programming inputs 342-1, . . . , 343-N, which are coupled to an n bit link 351 from a switching device control source. In accordance with the present invention this control source comprises a temperature sensor unit 350.

As pointed out above, the 'scaled' output current produced at output terminal 332 may be used for 'droop' compensation and over-current detection. The m×n decoder 340 effectively serves as a look-up table, and is operative to map its two sets of m and n inputs into a P bit output code, that is applied over output lines 343-1, . . . , 343-P to the controllably switched PFETs 330 of the auxiliary current mirror stages 310-1, . . . , 310-P.

As a non-limiting example, the temperature sensor unit 350 may be implemented as a digital N-bit counter and an associated semiconductor-based, temperature-dependent current sense element, that increments the counter when a first prescribed (programmed) temperature threshold is exceeded, and decrements the counter when the monitored temperature drops below a second prescribed (programmed) temperature threshold. The (N-bit) contents of the counter are coupled over N-bit link 351 to the decoder 340.

The M-bit programming inputs to the decoder 340 may be derived using any conventional programming elements, such as, but not limited to programming resistors, capacitors, EEPROM, EPROM, and the like. Where a resistor is used as a programming element, it may be coupled with a constant current source and an A-D converter, to define a set of programming codes, based upon the application. For the present exemplary application of providing temperature-based current compensation for variations in the drain-source resistance of the low side MOSFET of a buck mode DC—DC converter, the mapping table stored in the decoder may be defined in accordance with a priori knowledge of the thermal behavior characteristics of the MOSFET and/or by the use of a thermal sensor.

As noted previously, the use of programming inputs to the decoder provides the designer with flexibility as to placement of thermal detection components for the monitored elements (e.g., lower side MOSFET). Namely, if printed circuit board real estate will not accommodate placement of an internal thermal detector in relatively close proximity of the component whose behavior is to be tracked (e.g., the DC—DC converter's low side MOSFET), any offset between the actual temperature of the component and a relatively proximate monitoring location may be adjusted by an appropriate programming and mapping scheme for the decoder.

While we have shown and described an embodiment in accordance with the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed:

1. An apparatus for generating a regulated direct current (DC) output voltage comprising:
   a DC—DC converter coupled to a supply voltage, and being operative to generate a regulated output voltage derived from said supply voltage, said DC—DC converter having a pulse width modulation generator which generates a PWM switching signal that switchably controls operation of a switching circuit containing first and second electronic power switching devices coupled between respective first and second power supply terminals, a common node thereof being coupled through an inductor element to an output voltage terminal; and
   a controller for controlling the operation of said PWM generator, said controller including
      a sense amplifier unit having a first input coupled to said first power supply terminal, a second input and an output, a current feedback resistor electrically coupled between said common output node and said second input of said sense amplifier unit, a variable impedance coupled to said output of said sense amplifier unit and to said second input of said sense amplifier unit, said variable impedance configured to vary in impedance in response to said output of said sense amplifier unit, and a current sensing and correction circuit that is operative to sense current flowing through said variable impedance as a sensed current, and to supply, to said controller, a correction current having a step-wise temperature-compensating relationship to said sensed current.

2. The apparatus according to claim 1, wherein said current sensing and correction circuit contains a current mirror circuit having a current mirror stage to which said sensed current is coupled, and a plurality of controllably switched current mirror stages that are operative to produce respective output current components of said correction current.

3. The apparatus according to claim 2, wherein said first electronic power switching device comprises a MOSFET, and said current sensing and correction current is programmed to cause said correction current to compensate for a variation of drain-source resistance of said MOSFET with temperature.

4. The apparatus according to claim 3, wherein a respective controllably switched current mirror stage includes a current mirror that is operative to produce a respective output current component of said correction current, and a controlled switch device coupled between said controllably switched current mirror stage and a current port from which said correction current is supplied.

5. The apparatus according to claim 4, wherein said current sensing and correction circuit includes a decoder having a plurality of inputs to which programming information is supplied, and a plurality of outputs coupled to control inputs of said plurality of controllably switched current mirror stages.

6. The apparatus according to claim 4, wherein said current sensing and correction circuit includes a decoder having a first plurality of inputs coupled to receive temperature compensation representative coding information and a plurality of outputs coupled to control inputs of said plurality of controllably switched current mirror stages.

7. The apparatus according to claim 6, wherein said decoder has a first plurality of inputs coupled to receive temperature representative information from a temperature sensor thermally coupled with said first electronic power switching device, and a second plurality of inputs coupled to receive prescribed programming information, and wherein said decoder is operative to map contents of said temperature representative information and contents of said programming information into an output code that is coupled via said outputs to control inputs of said plurality of controllably switched current mirror stages.

8. A power supply comprising:

a buck mode pulse width modulator (PWM) DC—DC converter circuit having an input, a high side output and a low side output;

a high side switch coupled between a first voltage supply terminal and common output node, and being operative to control current flow therethrough in response to said high side output;

a low side switch coupled between said common output node and to a second voltage supply terminal, and being operative to control current flow therethrough in response to said low side output;

a sense amplifier unit having a first input, a second input and an output, said second input coupled to said second voltage supply terminal;

a current feedback resistor electrically coupled between said common output node and said first input of said sense amplifier;

a variable impedance component electrically connected to said output of said sense amplifier unit and to said first input of said sense amplifier, said variable impedance component configured to vary in impedance in response to said output of said sense amplifier unit;

a sensed current correction circuit, coupled to sense current flowing through said variable impedance component as a sensed current, and to supply a correction current having a step-wise temperature-compensating relationship to said sensed current to said input of said buck mode PWM DC—DC converter.

9. The power supply according to claim 8, wherein said current sensing and correction circuit contains a current mirror stage to which said sensed current is coupled, and a plurality of controllably switched current mirror stages that are operative to produce respective output current components of said correction current.

10. The power supply according to claim 9, wherein said first electronic power switching device comprises a MOSFET, and said current sensing and correction current is programmed to cause said correction current to compensate for a variation of drain-source resistance of said MOSFET with temperature.

11. The power supply according to claim 9, wherein a respective controllably switched current mirror stage includes an output current mirror that is operative to produce a respective output current component of said correction current, and a controlled switch device coupled between said controllably switched current mirror stage and a current port from which said correction current is supplied.

12. The power supply according to claim 11, wherein said current sensing and correction circuit includes a decoder having a plurality of inputs to which programming information is supplied, and a plurality of outputs coupled to control inputs of said plurality of controllably switched current mirror stages.

13. The power supply according to claim 11, wherein said current sensing and correction circuit includes a decoder having a first plurality of inputs coupled to receive temperature compensation representative coding information and a plurality of outputs coupled to control inputs of said plurality of controllably switched current mirror stages.

14. The power supply according to claim 13, wherein said decoder has a first plurality of inputs coupled to receive temperature representative information from a temperature sensor coupled with said first electronic power switching device, and a second plurality of inputs coupled to receive prescribed programming information, and wherein said decoder is operative to map contents of said temperature representative information and contents of said programming information into an output code that is coupled via said outputs to control inputs of said plurality of controllably switched current mirror stages.

15. A method of controlling the operation of a DC—DC converter, said DC—DC converter being coupled to a supply voltage, and being operative to generate a regulated output voltage derived from said supply voltage, said DC—DC converter including a pulse width modulation generator, which generates a PWM switching signal that switchably controls operation of a switching circuit containing first and second electronic power switching devices coupled between respective first and second power supply terminals, a common node thereof being coupled through an inductor element to an output voltage terminal, and a controller for controlling the operation of said PWM generator, said controller including a sense amplifier unit having a first input coupled to said first power supply terminal, a second input and an output, a current feedback resistor coupled between said common output node and said second input of said sense amplifier unit, a variable impedance coupled to said output of said sense amplifier unit, said variable impedance configured to vary in impedance in response to said output of said sense amplifier unit, and a current sense circuit coupled to said variable impedance, and being operative to sensed current flowing through said variable impedance as a sensed current, said method comprising the steps of:
(a) generating a correction current having a prescribed step-wise temperature-compensating relationship to said sensed current; and
(b) coupling said correction current to said controller, so that said controller controls the operation of said PWM generator in accordance with said correction current.

16. The method according to claim 15, wherein step (a) comprises coupling said sensed current to a stage of a current mirror, said current mirror having a plurality of controllably switched current mirror stages that are operative to produce respective output current components of said correction current.

17. The method according to claim 16, wherein said first electronic power switching device comprises a MOSFET, and wherein step (a) comprises programmably causing said correction current to compensate for a variation of drain-source resistance of said MOSFET with temperature.

18. The method according to claim 16, wherein a respective controllably switched current mirror stage includes an output current mirror that is operative to produce a respective output current component of said correction current, and a controlled switch device coupled between said controllably switched current mirror stage and an output current port from which said correction current is supplied.

19. The method according to claim 18, wherein step (a) decoding programming information and controlling said plurality of controllably switched current mirror stages in accordance with said programming information.

20. The method according to claim 18, wherein step (a) comprises providing a decoder having a first plurality of inputs coupled to receive temperature compensation representative coding information and a plurality of outputs coupled to control said plurality of controllably switched current mirror stages, said decoder having a first plurality of inputs coupled to receive temperature information from a temperature sensor thermally coupled with said first electronic power switching device, and a second plurality of inputs coupled to receive prescribed programming information, and wherein said decoder is operative to map contents of said temperature representative information and contents of said programming information into an output code that is coupled via said outputs to control inputs of said plurality of controllably switched current mirror stages.

* * * * *